(12) United States Patent
Sun

(10) Patent No.: US 11,307,317 B2
(45) Date of Patent: Apr. 19, 2022

(54) SYSTEMS AND METHODS FOR DATA ACQUISITION DESIGN OF SOURCE AND RECEIVER LOCATIONS

(71) Applicant: Saudi Arabian Oil Company, Dhahran (SA)

(72) Inventor: Yimin Sun, The Hague (NL)

(73) Assignee: Saudi Arabian Oil Company, Dhahran (SA)

( * ) Notice: Subject to any disclaimer, the term of this patent is extended or adjusted under 35 U.S.C. 154(b) by 345 days.

(21) Appl. No.: 16/460,582

(22) Filed: Jul. 2, 2019

(65) Prior Publication Data
US 2021/0003724 A1 Jan. 7, 2021

(51) Int. Cl.
*G01V 1/00* (2006.01)
*G06F 30/20* (2020.01)
*G01V 1/28* (2006.01)

(52) U.S. Cl.
CPC .............. *G01V 1/003* (2013.01); *G01V 1/282* (2013.01); *G06F 30/20* (2020.01); *G01V 2200/14* (2013.01)

(58) Field of Classification Search
CPC ................................ G01V 1/003; G01V 1/282
USPC ............................................................ 703/6
See application file for complete search history.

(56) References Cited

U.S. PATENT DOCUMENTS

| | | | | | |
|---|---|---|---|---|---|
| 5,260,911 | A | * | 11/1993 | Mason | G01V 1/286 367/57 |
| 5,588,032 | A | * | 12/1996 | Johnson | A61B 5/4312 378/8 |
| 6,587,540 | B1 | * | 7/2003 | Johnson | A61B 5/4312 378/4 |

(Continued)

FOREIGN PATENT DOCUMENTS

WO 2015066481 5/2015

OTHER PUBLICATIONS

Ishiyama et al. (Optimizing Seismic Survey Geometry with Blending Methods in a Transition Area, Society of Petroleum Engineers, 2016, pp. 1-9) (Year: 2016).*

(Continued)

*Primary Examiner* — Iftekhar A Khan
(74) *Attorney, Agent, or Firm* — Fish & Richardson P.C.

(57) ABSTRACT

Systems and methods, including computer-implemented systems and methods, for determining an optimized geometry of seismic sources and receivers in order to generate a desired dense wavefield. The systems and methods may include generating a simulated dense wavefield using a representative subsurface model; generating a set of preliminary acquisition plans according to constraints and the representative subsurface model, each preliminary acquisition plan defining a plurality of surface receivers operable to receive seismic signals; subsampling the target dense wavefield using the set of preliminary acquisition plans to produce a set of subsampled wavefields; reconstructing the set (Continued)

of subsampled wavefields according to a reconstruction scheme to produce a set of reconstructed dense wavefields; determining a degree of fidelity for each of the reconstructed dense wavefields; and selecting a preliminary acquisition plan having a degree of fidelity that satisfies a preselected criterion as an optimized acquisition plan.

23 Claims, 9 Drawing Sheets

(56) References Cited

U.S. PATENT DOCUMENTS

| | | | | |
|---|---|---|---|---|
| 8,699,297 | B2* | 4/2014 | Ozdemir | G01V 1/364 367/24 |
| 9,081,111 | B2* | 7/2015 | Amundsen | G01V 1/186 |
| 10,156,648 | B1* | 12/2018 | Jiang | G01V 1/003 |
| 10,809,402 | B2* | 10/2020 | Li | G01V 1/368 |
| 10,845,494 | B2* | 11/2020 | Zhao | G01V 1/366 |
| 2010/0161230 | A1* | 6/2010 | Chu | G01V 1/32 702/14 |
| 2011/0286305 | A1* | 11/2011 | Artman | G01V 1/282 367/38 |
| 2012/0300585 | A1* | 11/2012 | Cao | G01V 1/345 367/73 |
| 2013/0077439 | A1* | 3/2013 | Eick | G01V 1/003 367/73 |
| 2013/0077440 | A1* | 3/2013 | Cao | G01V 1/28 367/73 |
| 2014/0016436 | A1* | 1/2014 | Sollner | G01V 1/364 367/24 |
| 2014/0022860 | A1* | 1/2014 | Van Borselen | G01V 1/364 367/24 |
| 2014/0200812 | A1* | 7/2014 | Kitchenside | G01V 1/364 702/14 |
| 2014/0257780 | A1* | 9/2014 | Jing | G06F 30/20 703/6 |
| 2015/0212222 | A1* | 7/2015 | Poole | G01V 1/36 702/14 |
| 2015/0293241 | A1* | 10/2015 | Hegna | G01V 1/36 367/15 |
| 2015/0301208 | A1* | 10/2015 | Lewis | G01V 1/282 702/14 |
| 2015/0301209 | A1* | 10/2015 | Yarman | G01V 1/30 702/17 |
| 2016/0061974 | A1* | 3/2016 | Bansal | G01V 1/303 703/2 |
| 2016/0097870 | A1* | 4/2016 | Routh | G01V 1/003 703/2 |
| 2016/0306058 | A1* | 10/2016 | Nakata | G01V 1/288 |
| 2016/0327661 | A1* | 11/2016 | Mousa | G01V 1/164 |
| 2017/0082761 | A1* | 3/2017 | Li | G01V 1/368 |
| 2017/0090053 | A1* | 3/2017 | Eick | G01V 1/3808 |
| 2017/0097432 | A1* | 4/2017 | Poole | G01V 1/282 |
| 2017/0176614 | A1* | 6/2017 | Alhukail | G01V 1/30 |
| 2017/0235003 | A1* | 8/2017 | Elboth | G01V 1/003 367/17 |
| 2017/0248721 | A1* | 8/2017 | Poole | G01V 1/36 |
| 2018/0267188 | A1* | 9/2018 | Turquais | G01V 1/38 |
| 2019/0391286 | A1* | 12/2019 | Hardouin | G01V 1/003 |
| 2020/0124751 | A1* | 4/2020 | Poole | G01V 1/28 |
| 2020/0209419 | A1* | 7/2020 | Zhou | G01V 1/303 |

OTHER PUBLICATIONS

Wang et al. (Wavefield simulation and data-acquisition-scheme analysis for LWD acoustic tools in very slow formations, Geophysics, 2011, p. E59-E68) (Year: 2011).*

Mosher et al., "Increasing the Efficiency of Seismic Data Acquisition via Compressive Sensing" The leading edge, vol. 33, No. 4, Apr. 1, 2014, 386-388, 390-393, 7 pages.

Mosher et al., "Non-Uniform Optimal Sampling for Seismic Survey Design" 74th Eage Conference and Exhibition incorporating SPE Europec 2012, Jun. 4, 2012, 5 pages.

PCT International Search Report and Written Opinion in International Application No. PCT/US2020,040,126, dated Oct. 12, 2020, 12 pages.

Jesus, "Sensor Array Optimization for Seismic Estimation via Structured Sparse Inversion," IEEE, 2018, 5 pages.

Nakayama and Blacquiere, "Blended-acquisition design," Delphi Consortium Meeting, Den Haag, TU Delft (Delft University of Technology), Jun. 6, 2018, 75 pages.

Nuber et al., "Optimizing measurement geometry for seismic near-surface full waveform inversion,".

Wu et al., "Automated target oriented acquisition design in marine environment," Den Haag, Delphi Consortium, Delft University of Technology, Jun. 2018, 80 pages.

* cited by examiner

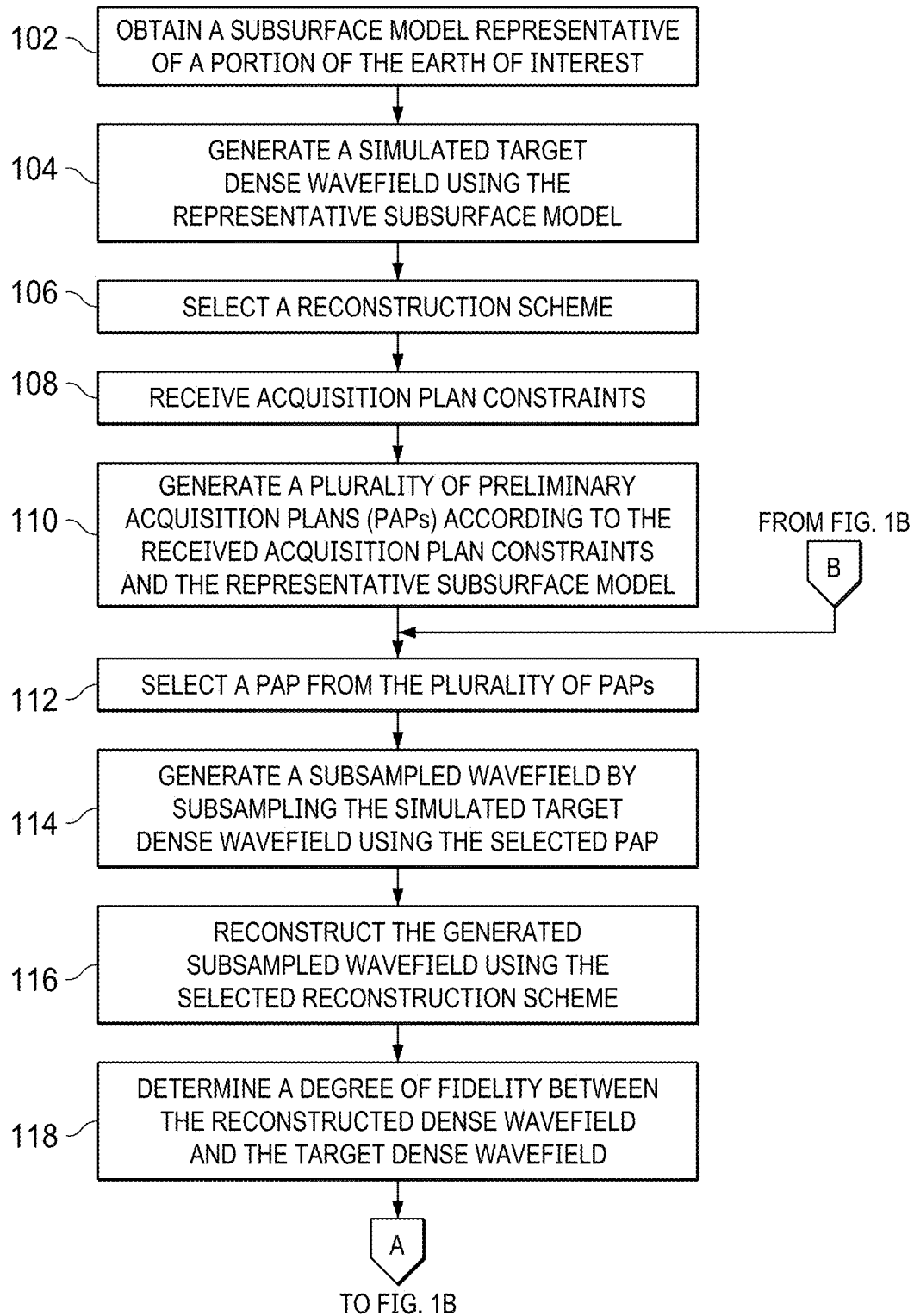

SYSTEMS AND METHODS FOR DATA ACQUISITION DESIGN OF SOURCE AND RECEIVER LOCATIONS

TECHNICAL FIELD

The present disclosure relates to seismic data acquisition design.

BACKGROUND

The quality of acquired seismic data affects the quality of any model that uses the acquired seismic data. Additionally, seismic data acquisition determines what subsequent data processing is needed in order to convert the seismic data into useful information, and the quality of the seismic data acquisition largely determines the ultimate success of a seismic exploration project.

SUMMARY

As first aspect of the present disclosure is directed to a computer-implemented method of optimizing a geometry seismic signal receivers, seismic sources, or both. The method may include generating a simulated dense wavefield using a representative subsurface model that represents a portion of the earth; generating a set of preliminary acquisition plans according to acquisition plan constraints and the representative subsurface model; subsampling the target dense wavefield using the set of preliminary acquisition plans to produce a set of subsampled wavefields, each of the subsampled wavefields being associated with a particular preliminary acquisition plan; reconstructing the set of subsampled wavefields according to a reconstruction scheme to produce a set of reconstructed dense wavefields; determining a degree of fidelity for each of the reconstructed dense wavefields; and selecting a preliminary acquisition plan having a degree of fidelity that satisfies a preselected criterion as an optimized acquisition plan. Each preliminary acquisition plan may define a plurality of surface receivers operable to receive seismic signals Another aspect of the disclosure is directed to a computer-implemented method performed by one or more processors for automatically selecting an optimized acquisition plan. The method may include generating a simulated dense wavefield using a representative subsurface model that represents a portion of the earth; generating a set of preliminary acquisition plans according to acquisition plan constraints and the representative subsurface model; subsampling the target dense wavefield using the set of preliminary acquisition plans to produce a set of subsampled wavefields, each of the subsampled wavefields being associated with a particular preliminary acquisition plan; reconstructing the set of subsampled wavefields according to a reconstruction scheme to produce a set of reconstructed dense wavefields; determining a degree of fidelity for each of the reconstructed dense wavefields; and selecting a preliminary acquisition plan having a degree of fidelity that satisfies a preselected criterion as the optimized acquisition plan. Each preliminary acquisition plan may define a plurality of surface receivers operable to receive seismic signals.

Another aspect of the present disclosure is directed to an apparatus for selecting an optimized distribution of seismic sources, seismic receivers, or both based on an optimized acquisition plan. The apparatus may include one or more processors and a non-transitory computer-readable storage medium coupled to the one or more processors and storing programming instructions for execution by the one or more processors. The programming instructions may be operable to instruct the one or more processors to generate a simulated dense wavefield using a representative subsurface model that represents a portion of the earth; generate a set of preliminary acquisition plans according to acquisition plan constraints and the representative subsurface model; subsample the target dense wavefield using the set of preliminary acquisition plans to produce a set of subsampled wavefields, each of the subsampled wavefields being associated with a particular preliminary acquisition plan; reconstruct the set of subsampled wavefields according to a reconstruction scheme to produce a set of reconstructed dense wavefields; determine a degree of fidelity for each of the reconstructed dense wavefields; and select a preliminary acquisition plan having a degree of fidelity that satisfies a preselected criterion as an optimized acquisition plan. Each preliminary acquisition plan may define a plurality of surface receivers operable to receive seismic signals.

The various aspects may include one or more of the following features. Selecting an optimized acquisition plan from the set of preliminary acquisition plans that has a degree of fidelity that best satisfies a preselected criterion may include selecting one of the preliminary acquisition plans having a degree of fidelity that meets a user-selected criterion as the optimized acquisition plan. Selecting one of the preliminary acquisition plans having a degree of fidelity that meets a user-selected criterion as the optimized acquisition plan may include selecting a preliminary acquisition plan having a degree of fidelity that is equal to a preselected value, is less than a preselected value, is greater than a preselected value, or is within a range of preselected values. Performing an iterative step may also be included. The iterative step may include applying a global optimization scheme to the set of preliminary acquisition plans to generate a new set of preliminary acquisition plans when none of the preliminary acquisition plans has a degree of fidelity that satisfies the preselected criterion; subsampling the target dense wavefield using the new set of preliminary acquisition plans to produce a new set of subsampled wavefields, each of the subsampled wavefields being associated with a particular new preliminary acquisition plan; reconstructing the set of new subsampled wavefields according to a reconstruction scheme to produce a set of reconstructed dense wavefields; determining a degree of fidelity for each of the new reconstructed dense wavefields; and selecting a new preliminary acquisition plan having a degree of fidelity that satisfies the preselected criterion as the optimized acquisition plan. The iterative step may be repeated for a selected number of cycles when none of the new preliminary acquisition plans of a particular iterative step has a degree of fidelity that satisfies the preselected criterion. A preliminary acquisition plan may be selected from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion. The representative subsurface model may be received, such as from a user. In some implementations, a system for selecting an optimized distribution of seismic sources may receive the representative subsurface model. Receiving the representative subsurface model may include generating the representative subsurface model. The acquisition plan constraints may be received, such as from a user.

The details of one or more implementations of the present disclosure are set forth in the accompanying drawings and the description to follow. Other features, objects, and advantages of the present disclosure will be apparent from the description and drawings, and from the claims.

DESCRIPTION OF DRAWINGS

FIGS. 1A and 1B are a flowchart of an example method for determining an optimized data acquisition plan, according to some implementations of the present disclosure.

Like reference symbols in the various drawings indicate like elements.

DETAILED DESCRIPTION

Figure 1B:
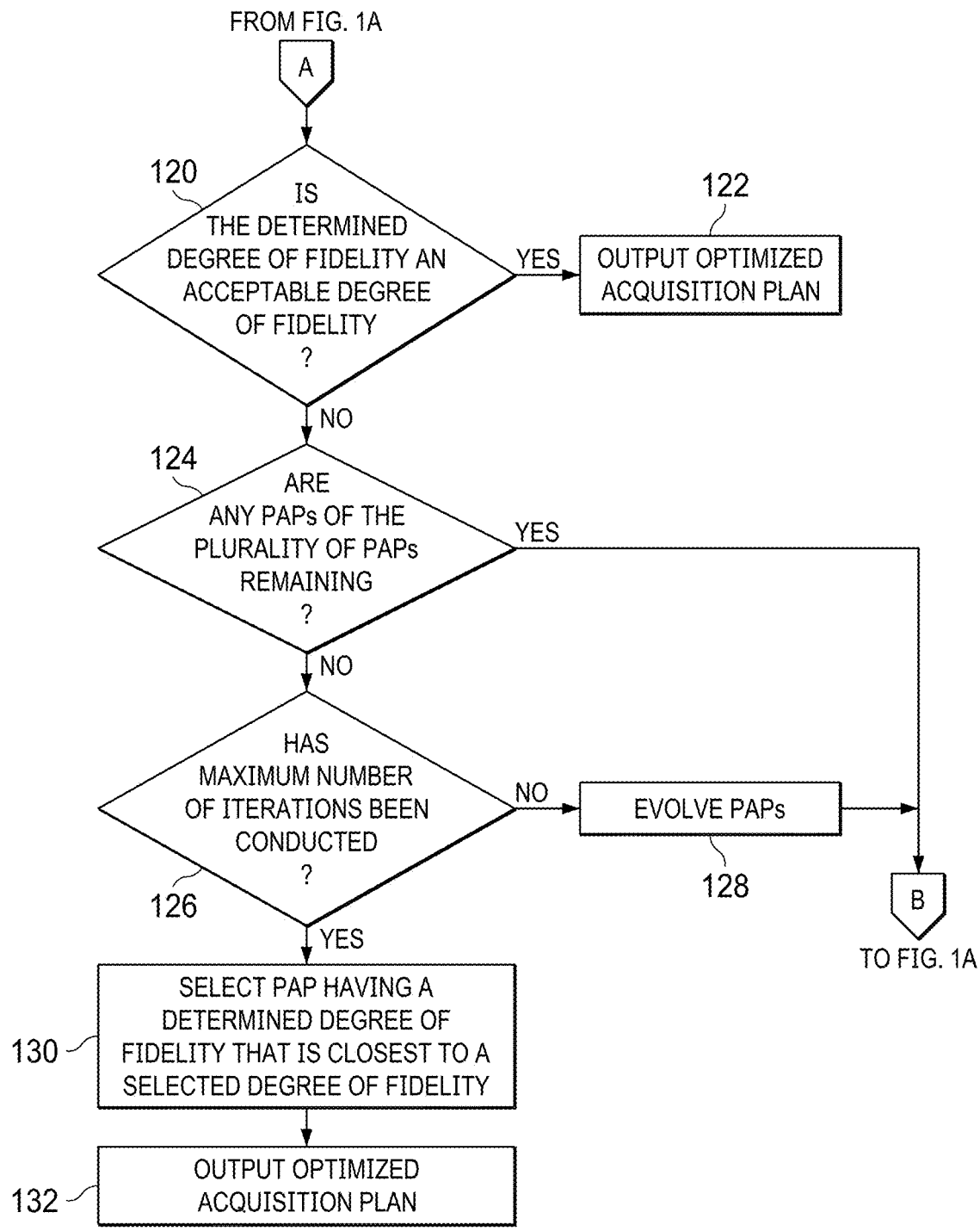

For the purposes of promoting an understanding of the principles of the present disclosure, reference will now be made to the implementations illustrated in the drawings, and specific language will be used to describe the same. Nevertheless, no limitation of the scope of the disclosure is intended. Any alterations and further modifications to the described devices, systems, methods, and any further application of the principles of the present disclosure are fully contemplated as would normally occur to one skilled in the art to which the disclosure relates. In particular, it is fully contemplated that the features, components, steps, or a combination of such described with respect to one implementation may be combined with the features, components, steps, or a combination of such described with respect to other implementations of the present disclosure.

The present disclosure is directed to systems and methods, and, particularly, computer systems and computer-implemented methods, for creating an optimized data acquisition plan. A preliminary acquisition plan is optimized when a determined degree of fidelity associated with the preliminary acquisition plan, as described in more detail later, meets a preselected value, is less than a preselected value, is greater than a preselected value, or is within a predetermined range. For example, in some implementations, a preliminary acquisition plan may be considered optimized when the determined degree of fidelity associated with the preliminary acquisition plan meets or is less than a preselected value. In other implementations, a preliminary acquisition plan may be optimized when a determined degree of fidelity associated with the preliminary acquisition plan is within a selected range of value or is greater than a selected value. An optimized data acquisition plan involves optimizing the locations of seismic sources (referred to as "sources") and receivers in order to produce a desired dense wavefield. In some implementations, the locations of the sources and receivers are optimized using a global optimization scheme.

For seismic data acquisition, the best data processing results are generally obtained where dense data in both the source domain and the receiver domain are used. However, due to cost considerations, obtaining dense data in both the source domain and the receiver domain practically is not possible. Consequently, data acquisition patterns for source and receiver geometries are selected to provide an acceptable trade-off between financial costs and the final data quality.

In practice, the acquired seismic data are generally sparse in one or several domains, such as shot gather domain, receiver domain, or common depth point (CDP) domain. During data processing, construction of a dense wavefield in a particular domain from the acquired seismic data is a main goal. However, constructing a dense wavefield from a sparse set of seismic data is challenging or, in some cases, not possible.

Presently, data acquisition design is generally detached from data reconstruction schemes. That is, data acquisition design is generally performed without taking data reconstruction into consideration. As a result, determining a data reconstruction scheme to reconstruct a dense wavefield from the acquired sparse seismic dataset poses challenges. In some cases, because of the nature of the acquired sparse seismic dataset, a reconstruction scheme may not exist that can produce a satisfactory dense wavefield. As a result of failing to take data reconstruction into consideration when designing a data acquisition plan, data reconstruction is challenging, and, in many cases, the resulting reconstructed dense wavefield is lacking.

FIGS. 1A and 1B are a flowchart of an example method 100 for determining an optimized data acquisition plan. At 102, a subsurface model representative of a portion of the earth of interest is generated, received, or otherwise obtained. In some implementations, the representative subsurface model may be a subsurface velocity model. In other implementations, the representative subsurface model may be a subsurface density model, a P-wave velocity model, or an S-wave velocity model. In still other implementations, other subsurface models may be used. In some instances, the representative subsurface model is generated using well log data. However, other data, including seismic data, may be used to generate the representative subsurface model. The resulting data acquisition becomes more useful as the subsurface model more closely represents the actual subsurface conditions.

At 104, a simulated target dense wavefield is generated based on the representative subsurface model. In order to generate the target dense wavefield, a grid is defined at the surface of the representative subsurface model. In some implementation, the grid is an orthogonal grid in which a first spacing between a first set of parallel lines is the same as a second spacing between a second set of parallel lines, the first set of parallel lines being perpendicular to the second set of parallel lines. For example, the first and second spacings may be 12.5 meters, 6.25 meter, or any other desired spacing. In some implementations, a spacing between the first set of parallel lines may be different than a spacing of the second set of parallel lines. Further, the line spacing in the first set of parallel lines, the second set of parallel lines, or both may vary. Still further, other types of grids may be used, such as a radial grid, a triangular grid, a polynomial grid, or other type of grid.

A spacing of the grid may be selected and even altered based on the desired target dense wavefield. With the spacing and design of the grid completed, a target dense wavefield is automatically determined. The resulting target dense wavefield is one that would produce the representative subsurface model as well as populate all of the grid points (that is the nodes where lines of the grid intersect each other) of the selected grid. As mentioned earlier, the grid may be altered in order to create a desired target dense wavefield. In some implementations, the target dense wavefield is generated using forward modeling. Various methods may be used to perform the forward modeling, including a finite-difference method, a finite-element method, and a ray tracing method.

At 106, a reconstruction scheme is selected. The reconstruction scheme utilizes a subsampled wavefield, discussed in more detail later, to reproduce the target dense wavefield based on acquisition plans that include sources and receivers as selected positions within the grid. Any of a number of reconstruction schemes may be used, including, among others, high-dimension anti-leakage Fourier reconstruction, sparse reconstruction in the Radon domain, and projections onto convex sets (POCS). Reconstruction of a target dense wavefield using a subsampled wavefield is discussed in more detail later.

At 108, constraints of an acquisition plan are received or otherwise identified. The various constraints may include the number of sources; the number of receivers; a number of shots to be used; a number of receivers to be used to acquire a wavefield from each shot; geographic limitations; source position limitations; and receiver position limitations. Other constraints or aspects may also be included. Moreover, in some limitations, additional or fewer aspects may be used. These different constraints are used to automatically generate one or a plurality of preliminary acquisition plans, and these preliminary acquisition plans are used to determine an optimized acquisition plan.

At 110, a plurality of preliminary acquisition plans are generated based on the inputted constraints, representative subsurface model, and the selected grid. In some implementations, the preliminary acquisition plans are generated randomly. In other implementations, one or more of the preliminary acquisition plans may be user-generated while maintaining the previously added constraints. The preliminary acquisition plans are created by distributing the sources and receivers along the grid (at particular nodes of the grid) according to the received constraints. In light of the applicable constraints, grid design, or both, the number of possible preliminary acquisition plans may be a finite number of preliminary acquisition plans.

At 112, one of the plurality of preliminary acquisition plans is selected. At 114, the selected preliminary acquisition plans is used to subsample the simulated target dense wavefield described earlier to generate an associated subsampled wavefield. In some implementations, the simulated target dense wavefield is subsampled by replacing one or more traces that form the simulated target dense wavefield with a zero trace according to the preliminary acquisition plan. Particularly, a zero trace is added to the target dense wavefield at the nodes of the grid where a receiver is not present according to the preliminary acquisition plan. In this way, the resulting subsampled wavefield mimics the arrangement of sources and receivers associated with a particular preliminary acquisition plan.

At 116, the generated subsampled wavefield is reconstructed using the reconstruction scheme previously selected. The reconstruction scheme uses interpolation to "reconstruct" or generate an approximation of the target dense wavefield from the subsampled wavefield. This approximation of the target dense wavefield is termed a reconstructed dense wavefield.

In the present method 100, each preliminary acquisition plan is analyzed in series, such that a subsampled wavefield and reconstructed dense wavefield for a preliminary acquisition plan is generated when the particular preliminary acquisition plan is being analyzed. In other implementations, a subsampled wavefield and reconstructed wavefield for each preliminary acquisition plan may be determined together prior to individual analysis.

At 118, a degree of fidelity is determined between the reconstructed dense wavefield and the target dense wavefield. Numerous approaches may be used to determine the degree of fidelity. For example, methods used to determine an amount of mismatch between different signals may be used to determine the degree of fidelity. An example method for determining a mismatch or degree of fidelity is the L2 norm method. The L2 norm method is a type of function space within the family of Lebesgue spaces or $L^p$ spaces. Other methods for determining a degree of mismatch between the reconstructed dense wavefield and the target dense wavefield may be used. For example, other methods that may be used to determine the degree of fidelity include other function spaces, including the L0 norm; L1 norm; cross-correlation based target function; L2,1 norm, and the more generalized Lr,p norm function space.

At 120, the degree of fidelity is compared to a preselected criterion. In some implementations, the preselected criterion is a preselected acceptable degree of fidelity. An acceptable degree of fidelity between the reconstructed dense wavefield and the target dense wavefield may be selected or inputted by a user. For example, an acceptable degree of fidelity may be a user-selected value or user-inputted range of values. If the determined degree of fidelity is at or less than a selected degree of fidelity or within the selected range of acceptable fidelity, then, at 122, the preliminary acquisition plan associated with reconstructed dense wavefield is identified as being optimized, and the identified acquisition plan is may be used to acquire real-world seismic data at the location of interest. Thus, a preliminary acquisition plan is optimized when a determined degree of fidelity associated with the preliminary acquisition plan meets a preselected value or is within a predetermined range. For example, in some implementations, a preliminary acquisition plan may be considered optimized when the determined degree of fidelity associated with the preliminary acquisition plan meets or is less than a preselected value. Also, in some implementations, if a degree of fidelity is realized for a particular preliminary acquisition plan, then the no further degree of fidelity for the remaining preliminary acquisition plans is examined. Alternatively, in other implementations, the remaining preliminary acquisition plans may be analyzed even when a degree of fidelity associated with another of the preliminary acquisition plans meets a preselected criterion. This continued analysis may be used to determine whether another of the preliminary acquisition plans provides an even better degree of fidelity than one or more of the preliminary acquisition plans already analyzed. If a preliminary acquisition plan with a degree of fidelity closure to the selected criterion is identified, then that preliminary acquisition plan is identified as the target acquisition plan.

If the degree of fidelity of the preliminary acquisition plan does not satisfy the selected criterion, then, at 124, a determination is made as to whether any remaining preliminary acquisition plans remain unexamined. If one or more other preliminary acquisition plans remain, then a next preliminary acquisition plan (PAP) is selected at 112. This analysis continues until a preliminary acquisition plan is determined to have a degree of fidelity that satisfies the criterion, at which point an optimized acquisition plan is identified.

If none of the preliminary acquisition plans satisfies the degree of fidelity criterion, then, at 126, a determination is made as to whether a maximum number of iterations has occurred. If the maximum number of iterations has not yet occurred, then, at 128, the present set of preliminary acquisition plans is evolved using a global optimization scheme to produce a new set of preliminary acquisition plans. The method continues to 112, where one of the new preliminary acquisition plans of this new set of preliminary acquisition plans is selected for analysis and a determination is made as to whether any of these new preliminary acquisition plans provides a degree of fidelity that satisfies the preselected criterion.

Numerous global optimization schemes may be used to evolve the set of preliminary acquisition plans. For example, genetic algorithms (such as an enhanced genetic algorithm), particle swarm optimization algorithms, ant colony optimization algorithms, differential evolution algorithms, and evolution strategy algorithms may be used to evolve the set of preliminary acquisition plans.

This iterative process continues until an acquisition plan satisfying a preselected criterion is determined or until the maximum number of iterations has been met. If, at 126, the maximum number of iterations is met, then, at 130, of the entire set of preliminary acquisition plans analyzed, the preliminary acquisition plan having the degree of fidelity that is closest to the preselected criterion is identified as the optimized acquisition plan. At 132, this optimized acquisition plan is output.

The methods and systems described in the present disclosure for determining an optimized acquisition plan omit any assumption premised on signals used to generate seismic data. As a result, these systems and methods provide a more robust approach for determining a tailored data acquisition plan that better suits a data reconstruction scheme that is needed to convert acquired seismic data into useful information and produce a subsurface model that better reflects the subsurface conditions. With the use of the determined optimized acquisition plan, a better quality final dense dataset is obtainable.

Figure 2:
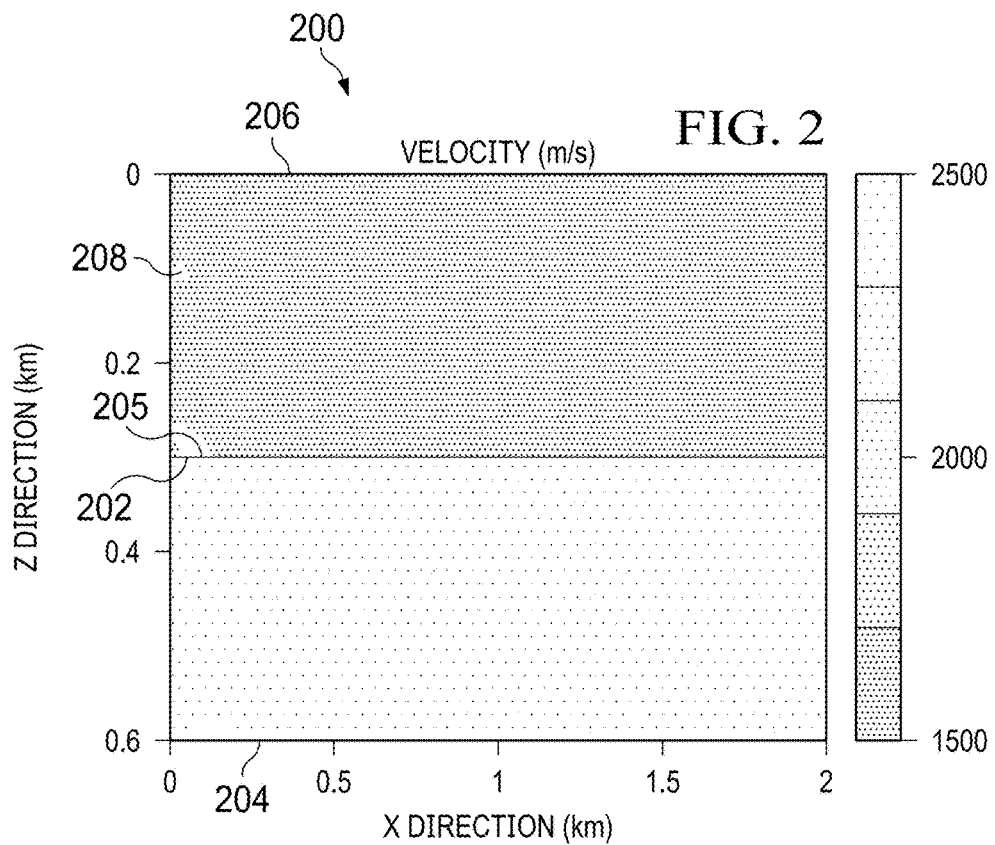
FIG. 2 is an example two-dimensional velocity, according to some implementations of the present disclosure.
Figure 3:
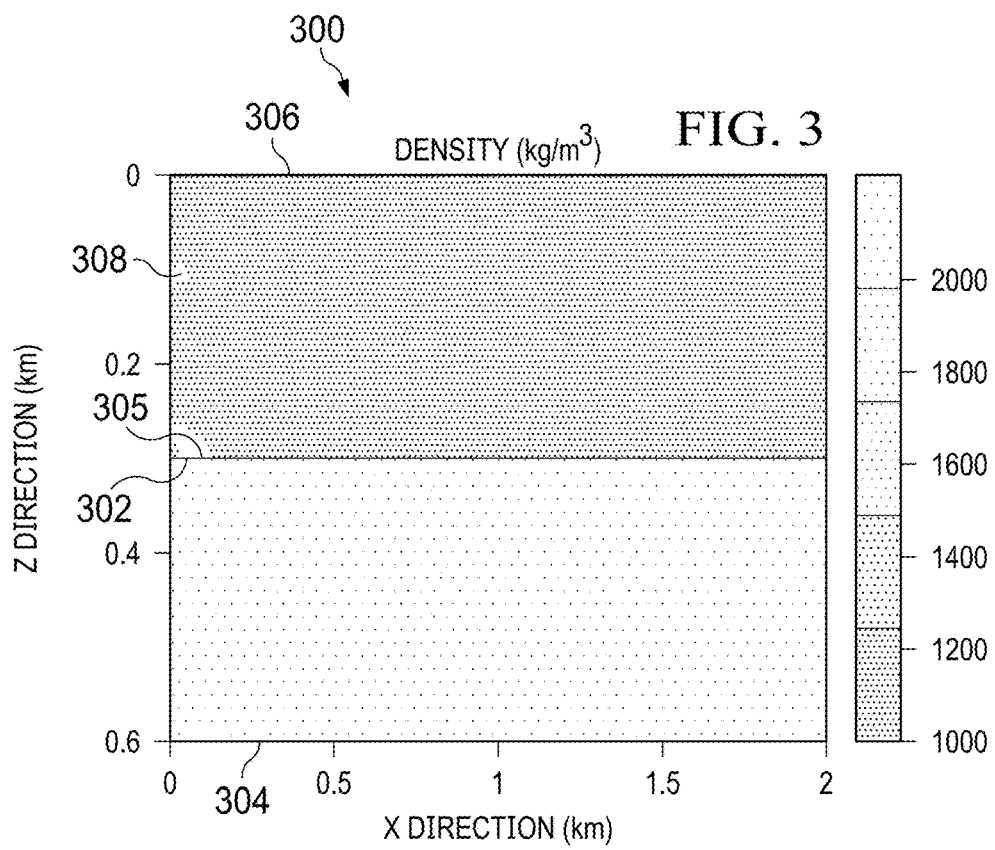
FIG. 3 is a two-dimensional density model, according to some implementations of the present disclosure.

An example application of these systems and methods is described. FIG. 2 is an example two-dimensional velocity model 200, and FIG. 3 is an associated two-dimensional density model 300. Each of the models 200 and 300 include a single reflector 202 and 302, respectively. In this example, the x-axis 204 represents the length of the model 200 in kilometers (km), and the x-axis 304 represents the length of the model 300 in km. The y-axis 208 in FIG. 2 represents a vertical distance, in kilometers (km), below a surface 206 of water 208, and the y-axis 308 in FIG. 3 represents a vertical distance, in km, below a surface 306 of water 308. As shown, the length of each of the models 200 and 300 is 2 kilometers, and the reflectors 202 and 302 are located on a floor 205 and 305 at a depth of 600 meters below the surface 206 and 306 of the water 208 and 308, respectively.

In this example, a simulated target dense wavefield is generated using a finite-difference time-domain method. The sources and the receivers are located at ten meters below the surface of the water, and direct-arrival signals are removed from the final dataset. Additionally, a free-surface condition is applied to the surface of the water. As a result, the data contain surface-related multiples. That is, the data contain wavefields reflected by a surface, such as the surface of the water. A total number of four shot gathers with sources located at locations (which correspond to respective locations on the x-axis) of 400 meters, 800 meters, 1200 meters, and 1600 meters are collected. Thus, adjacent sources are separated by 400 meters. The source wavelet is selected to be a Ricker wavelet with a dominant frequency at 10 Hertz and a maximum frequency at 30 Hertz. A uniform, orthogonal grid having a spacing of 20 meters is defined at the floor, and each dense shot gather include 101 traces. Random noise is added to the final data in order to more closely resemble real-world conditions. A signal-to-noise ratio (SNR) of 10 is used; a record length of 1 second is used; and a sampling rate of 4 milliseconds is used.

The goal of the experiment is to create an acquisition plan that optimizes 51 receivers that can reside at any of the nodes of the 20 meter grid. The reconstruction scheme used in this data acquisition design is the POCS method based upon an exponential threshold model, and the global search method used is the enhanced Genetic Algorithm.

Figure 4:
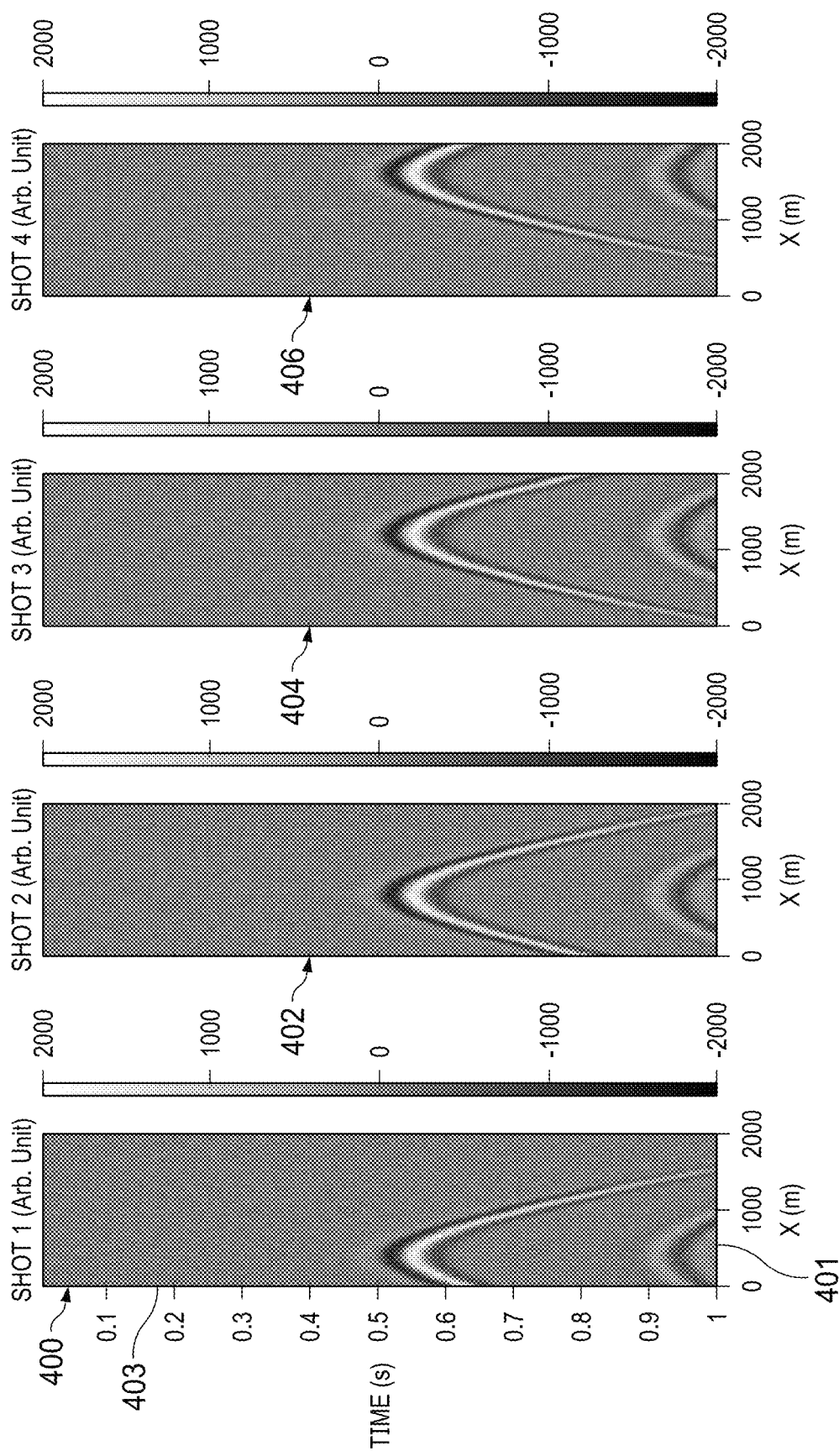
FIG. 4 are plots showing a target dense wavefield for each shot gather, according to some implementations of the present disclosure.
Figure 5:
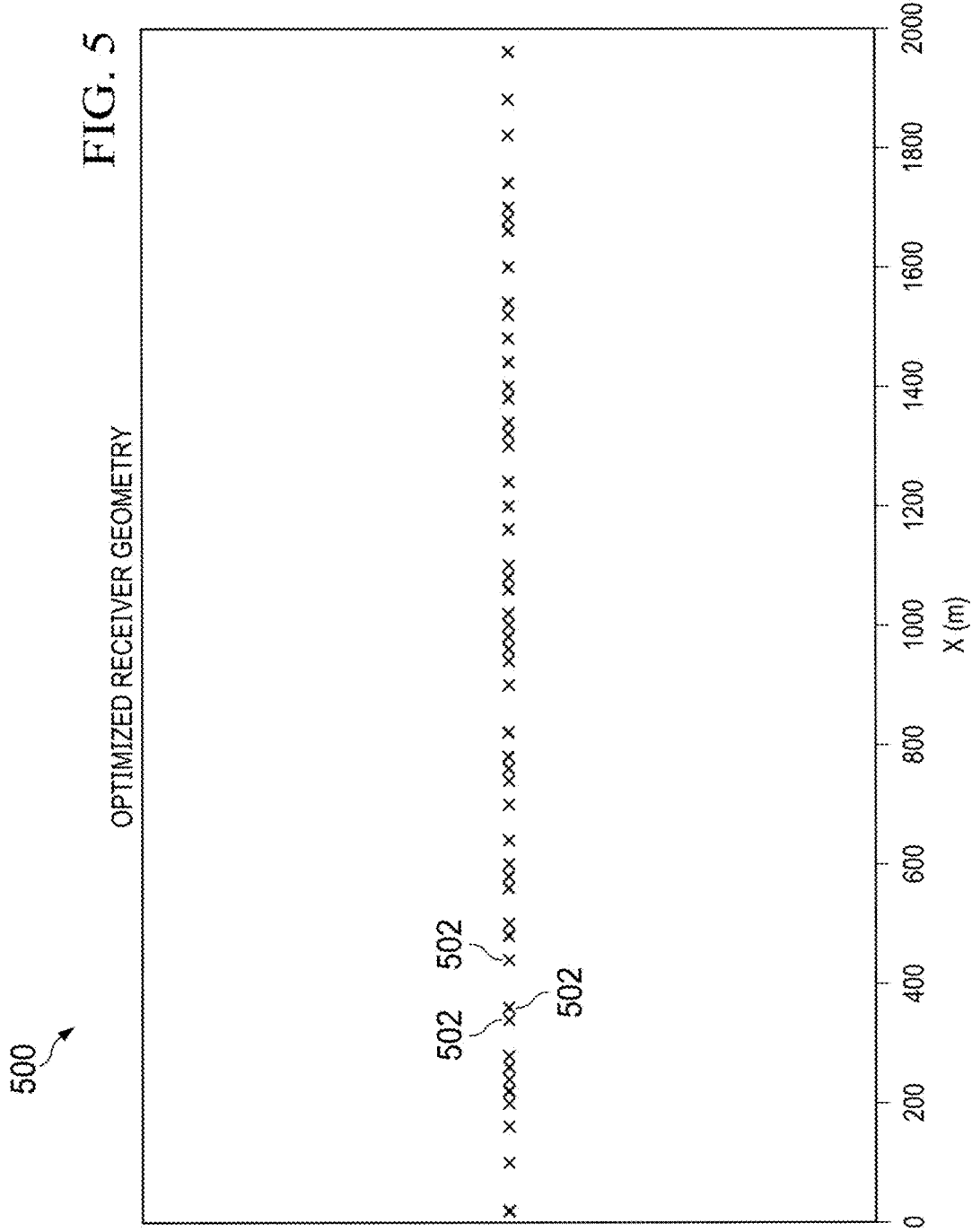
FIG. 5 is an optimized receiver geometry obtained according to some implementations of the present disclosure.
Figure 6:
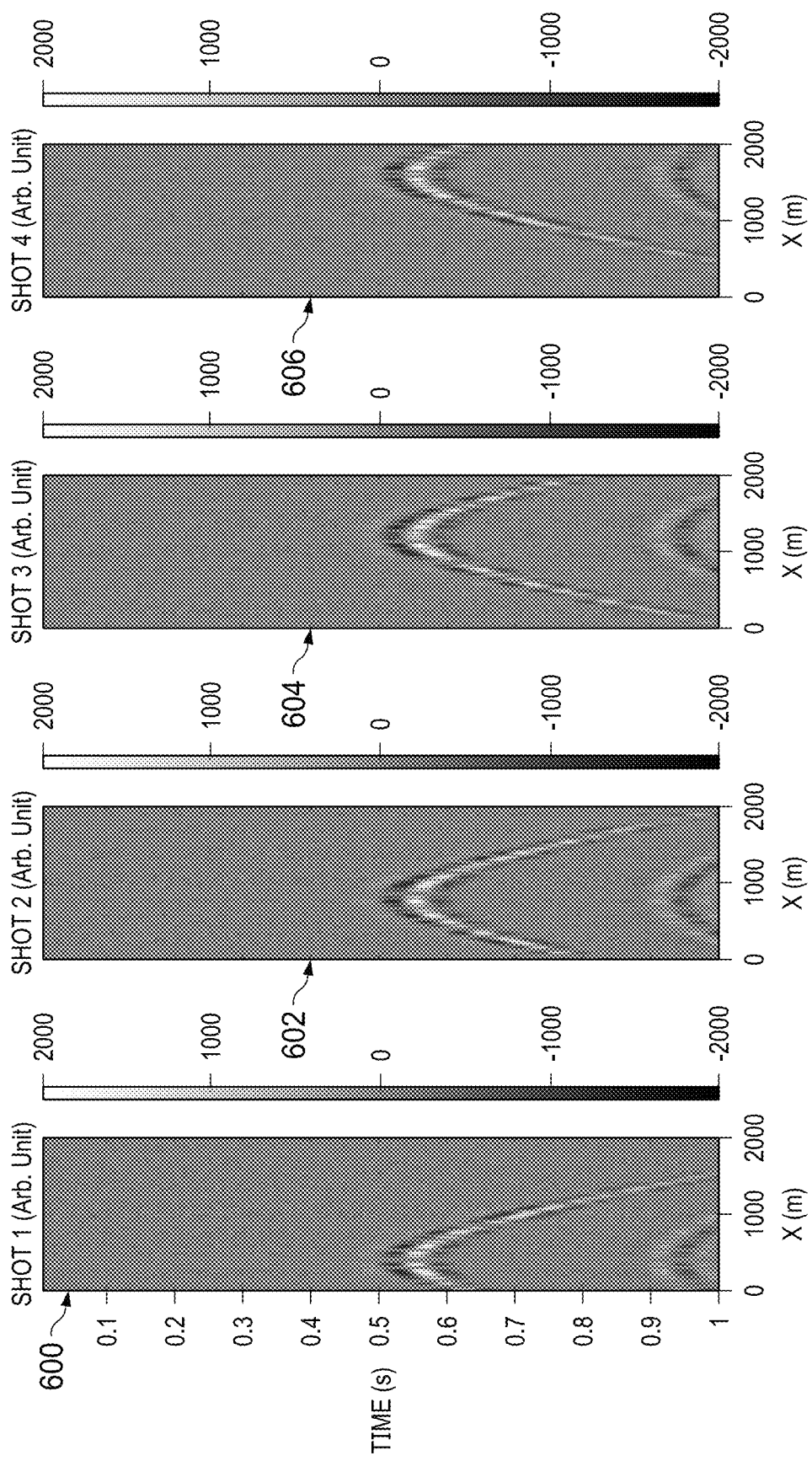
FIG. 6 is a series of graphs showing subsampled wavefields using the optimized receiver geometry of FIG. 5.
Figure 7:
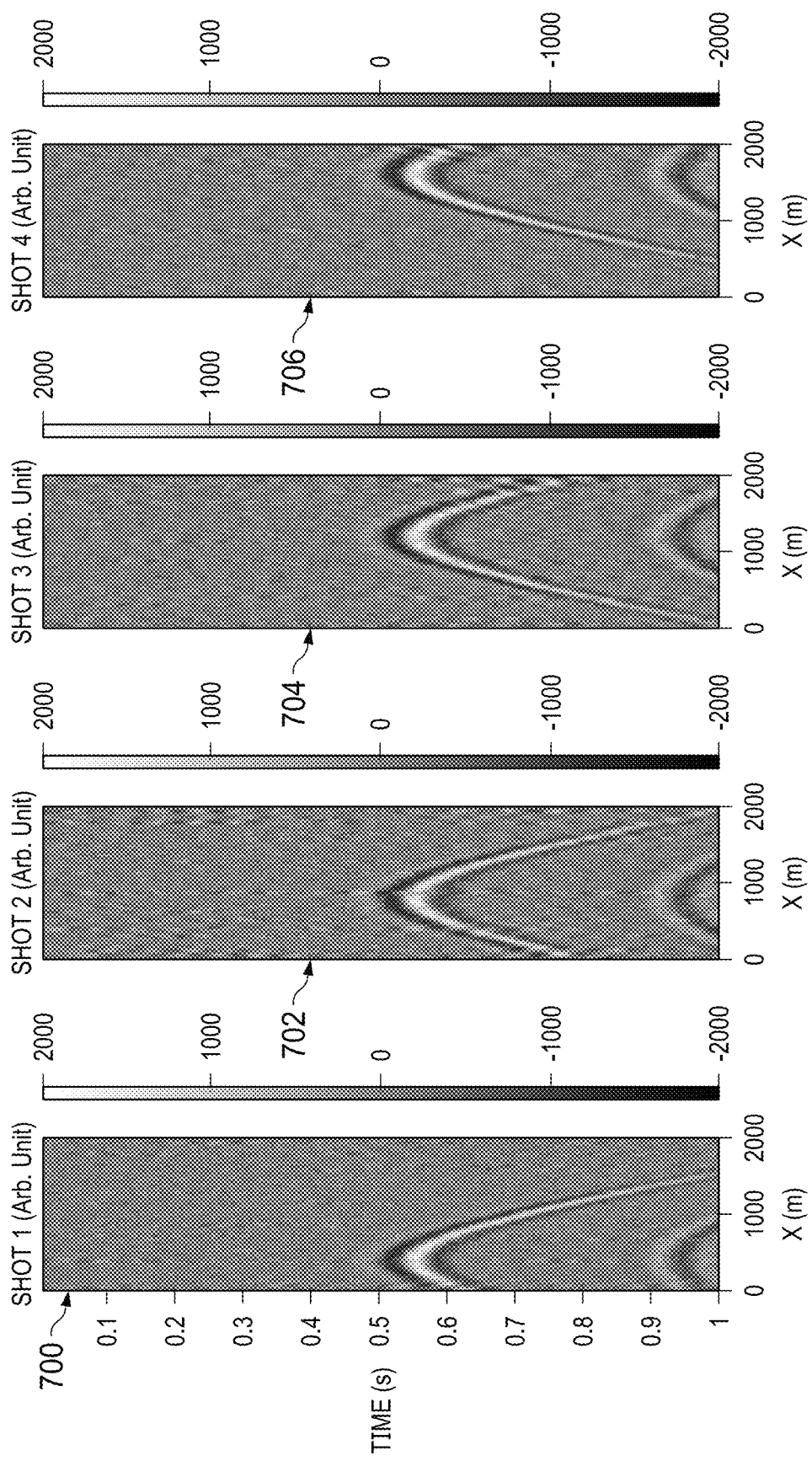
FIG. 7 shows reconstructed wavefields of each shot gathers of the subsampled wavefields of FIG. 6.
Figure 8:
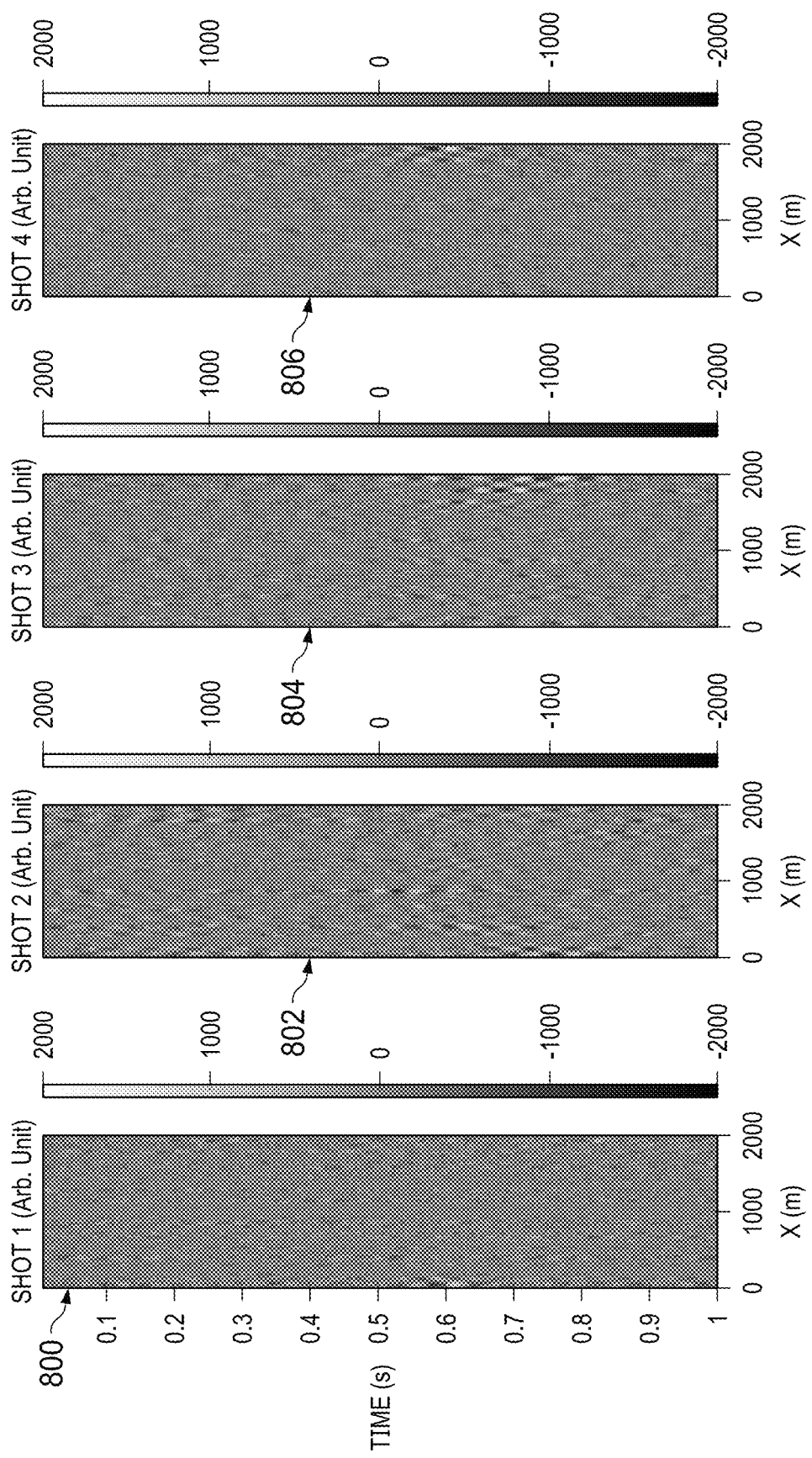
FIG. 8 is a series of graphs showing the differences between the reconstructed wavefields of FIG. 7 and the corresponding target dense wavefields of FIG. 4.

FIG. 4 are plots showing a target dense wavefield for each shot gather. Each of the plots shown in FIG. 4 include an x-axis 401 indicating a horizontal distance, in meters (m), from a receiver. Each of the plots in FIG. 4 also includes a y-axis 403 that identifies a record length time in seconds (s). Plot 400 is a plot of a first shot associated with the sources located at 400 meters. Plot 402 is a plot of a second shot associated with the sources located at 800 meters. Plot 404 is a plot of a third shot associated with the sources located at 1200 meters. Plot 406 is a plot of a fourth shot associated with the sources located at 1600 meters. A target dense wavefield is generated for each shot gather. FIG. 5 shows the optimized receiver geometry 500. Receiver locations 502 are marked as crosses. FIG. 6 is a series of graphs showing subsampled wavefields using the optimized receiver geometry of FIG. 5 associated with the respective shot gathers. Particularly, graph 600 shows the subsampled wavefield associated with sources located at 400 meters; graph 602 shows the subsampled wavefield associated with sources located at 800 meters; graph 604 shows the subsampled wavefield associated with the sources located at 1200 meters; and graph 606 shows the subsampled wavefield associated with the sources located at 1600 meters. FIG. 7 shows the corresponding reconstructed wavefields of each shot gather. Graph 700 represents the reconstructed wavefield associated with sources located at 400 meters; graph 702 represents the reconstructed wavefield associated with sources located at 800 meters; graph 704 represents the reconstructed wavefield associated with sources located at 1200 meters; and graph 706 represents the reconstructed wavefield associated with sources located at 1600 meters. The differences between the reconstructed wavefields and the corresponding target dense wavefields are shown in FIG. 8. The differences associated with sources at 400 meters, 800 meters, 1200 meters, and 1600 meters are shown in graphs 800, 802, 804, and 806, respectively.

Figure 9:
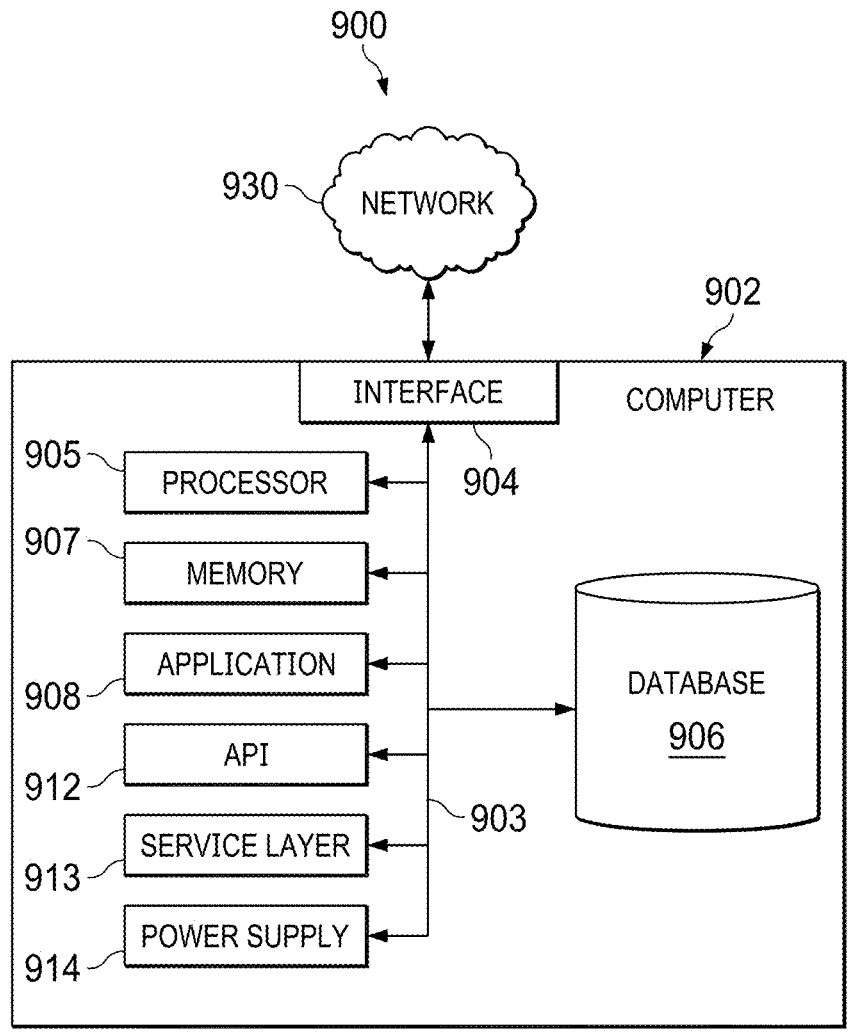
FIG. 9 is a block diagram illustrating an example computer system used to provide computational functionalities associated with described algorithms, methods, functions, processes, flows, and procedures as described in the present disclosure, according to some implementations of the present disclosure.

FIG. 9 is a block diagram of an example computer system 900 used to provide computational functionalities associated with described algorithms, methods, functions, processes, flows, and procedures described in the present disclosure, according to some implementations of the present disclosure. The illustrated computer 902 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 902 can include input devices such as keypads, keyboards, and touch screens that can accept user information. Also, the computer 902 can include output devices that can convey information associated with the operation of the computer 902. The information can include digital data, visual data, audio information, or a combination of information. The information can be presented in a graphical user interface (UI) (or GUI).

The computer 902 can serve in a role as a client, a network component, a server, a database, a persistency, or components of a computer system for performing the subject matter described in the present disclosure. The illustrated computer 902 is communicably coupled with a network 930. In some implementations, one or more components of the computer 902 can be configured to operate within different environments, including cloud-computing-based environments, local environments, global environments, and combinations of environments.

At a high level, the computer 902 is an electronic computing device operable to receive, transmit, process, store, and manage data and information associated with the described subject matter. According to some implementations, the computer 902 can also include, or be communicably coupled with, an application server, an email server, a web server, a caching server, a streaming data server, or a combination of servers.

The computer 902 can receive requests over network 930 from a client application (for example, executing on another computer 902). The computer 902 can respond to the received requests by processing the received requests using software applications. Requests can also be sent to the computer 902 from internal users (for example, from a command console), external (or third) parties, automated applications, entities, individuals, systems, and computers.

Each of the components of the computer 902 can communicate using a system bus 903. In some implementations, any or all of the components of the computer 902, including hardware or software components, can interface with each other or the interface 904 (or a combination of both), over the system bus 903. Interfaces can use an application programming interface (API) 912, a service layer 913, or a combination of the API 912 and service layer 913. The API 912 can include specifications for routines, data structures, and object classes. The API 912 can be either computer-language independent or dependent. The API 912 can refer to a complete interface, a single function, or a set of APIs.

The service layer 913 can provide software services to the computer 902 and other components (whether illustrated or not) that are communicably coupled to the computer 902. The functionality of the computer 902 can be accessible for all service consumers using this service layer. Software services, such as those provided by the service layer 913, can provide reusable, defined functionalities through a defined interface. For example, the interface can be software written in JAVA, C++, or a language providing data in extensible markup language (XML) format. While illustrated as an integrated component of the computer 902, in alternative implementations, the API 912 or the service layer 913 can be stand-alone components in relation to other components of the computer 902 and other components communicably coupled to the computer 902. Moreover, any or all parts of the API 912 or the service layer 913 can be implemented as child or sub-modules of another software module, enterprise application, or hardware module without departing from the scope of the present disclosure.

The computer 902 includes an interface 904. Although illustrated as a single interface 904 in FIG. 9, two or more interfaces 904 can be used according to particular needs, desires, or particular implementations of the computer 902 and the described functionality. The interface 904 can be used by the computer 902 for communicating with other systems that are connected to the network 930 (whether illustrated or not) in a distributed environment. Generally, the interface 904 can include, or be implemented using, logic encoded in software or hardware (or a combination of software and hardware) operable to communicate with the network 930. More specifically, the interface 904 can include software supporting one or more communication protocols associated with communications. As such, the network 930 or the interface's hardware can be operable to communicate physical signals within and outside of the illustrated computer 902.

The computer 902 includes a processor 905. Although illustrated as a single processor 905 in FIG. 9, two or more processors 905 can be used according to particular needs, desires, or particular implementations of the computer 902 and the described functionality. Generally, the processor 905 can execute instructions and can manipulate data to perform the operations of the computer 902, including operations using algorithms, methods, functions, processes, flows, and procedures as described in the present disclosure.

The computer 902 also includes a database 906 that can hold data for the computer 902 and other components connected to the network 930 (whether illustrated or not). For example, database 906 can be an in-memory, conventional, or a database storing data consistent with the present disclosure. In some implementations, database 906 can be a combination of two or more different database types (for example, hybrid in-memory and conventional databases) according to particular needs, desires, or particular implementations of the computer 902 and the described functionality. Although illustrated as a single database 906 in FIG. 9, two or more databases (of the same, different, or combination of types) can be used according to particular needs, desires, or particular implementations of the computer 902 and the described functionality. While database 906 is illustrated as an internal component of the computer 902, in alternative implementations, database 906 can be external to the computer 902.

The computer 902 also includes a memory 907 that can hold data for the computer 902 or a combination of components connected to the network 930 (whether illustrated or not). Memory 907 can store any data consistent with the present disclosure. In some implementations, memory 907 can be a combination of two or more different types of memory (for example, a combination of semiconductor and magnetic storage) according to particular needs, desires, or particular implementations of the computer 902 and the described functionality. Although illustrated as a single memory 907 in FIG. 9, two or more memories 907 (of the same, different, or combination of types) can be used according to particular needs, desires, or particular implementations of the computer 902 and the described functionality. While memory 907 is illustrated as an internal component of the computer 902, in alternative implementations, memory 907 can be external to the computer 902.

The application 908 can be an algorithmic software engine providing functionality according to particular needs, desires, or particular implementations of the computer 902 and the described functionality. For example, application 908 can serve as one or more components, modules, or applications. Further, although illustrated as a single application 908, the application 908 can be implemented as multiple applications 908 on the computer 902. In addition, although illustrated as internal to the computer 902, in alternative implementations, the application 908 can be external to the computer 902.

The computer 902 can also include a power supply 914. The power supply 914 can include a rechargeable or non-rechargeable battery that can be configured to be either user- or non-user-replaceable. In some implementations, the power supply 914 can include power-conversion and management circuits, including recharging, standby, and power management functionalities. In some implementations, the power-supply 914 can include a power plug to allow the computer 902 to be plugged into a wall socket or a power source to, for example, power the computer 902 or recharge a rechargeable battery.

There can be any number of computers 902 associated with, or external to, a computer system containing computer 902, with each computer 902 communicating over network 930. Further, the terms "client," "user," and other appropriate terminology can be used interchangeably, as appropriate, without departing from the scope of the present disclosure. Moreover, the present disclosure contemplates that many users can use one computer 902 and one user can use multiple computers 902.

Described implementations of the subject matter can include one or more features, alone or in combination.

For example, in a first implementation, a computer-implemented method includes: generating a simulated dense wavefield using a representative subsurface model that represents a portion of the earth; generating a set of preliminary acquisition plans according to acquisition plan constraints and the representative subsurface model, each preliminary acquisition plan defining a plurality of surface receivers operable to receive seismic signals; subsampling the target dense wavefield using the set of preliminary acquisition plans to produce a set of subsampled wavefields, each of the subsampled wavefields being associated with a particular preliminary acquisition plan; reconstructing the set of subsampled wavefields wavelets according to a reconstruction scheme to produce a set of reconstructed dense wavefields; determining a degree of fidelity for each of the reconstructed dense wavefields; and selecting a preliminary acquisition plan having a degree of fidelity that satisfies a preselected criterion as the optimized acquisition plan.

The foregoing and other described implementations can each, optionally, include one or more of the following features:

A first feature, combinable with any of the following features, wherein selecting an optimized acquisition plan from the set of preliminary acquisition plans that has a degree of fidelity that best satisfies a preselected criterion includes selecting one of the preliminary acquisition plans having a degree of fidelity that meets a user-selected criterion as the optimized acquisition plan.

A second feature, combinable with any of the previous or following features, wherein selecting one of the preliminary acquisition plans having a degree of fidelity that meets a user-selected criterion as the optimized acquisition plan includes selecting a preliminary acquisition plan having a degree of fidelity that is equal to a preselected value, is less than a preselected value, is greater than a preselected value, or is within a range of preselected values.

A third feature, combinable with any of the previous or following features, the method further including performing an iterative step that includes: applying a global optimization scheme to the set of preliminary acquisition plans to generate a new set of preliminary acquisition plans when none of the preliminary acquisition plans has a degree of fidelity that satisfies the preselected criterion; subsampling the target dense wavefield using the new set of preliminary acquisition plans to produce a new set of subsampled wavefields, each of the subsampled wavefields wavelets being associated with a particular new preliminary acquisition plan; reconstructing the set of new subsampled wavefields wavelets according to a reconstruction scheme to produce a set of reconstructed dense wavefields; determining a degree of fidelity for each of the newly reconstructed dense wavefields; and selecting a new preliminary acquisition plan having a degree of fidelity that satisfies the preselected criterion as the optimized acquisition plan.

A fourth feature, combinable with any of the previous or following features, the method further including repeating the iterative step for a selected number of cycles when none of the new preliminary acquisition plans of a particular iterative step has a degree of fidelity that satisfies the preselected criterion.

A fifth feature, combinable with any of the previous or following features, the method further including selecting a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

A sixth feature, combinable with any of the previous or following features, the method further including receiving the representative subsurface model.

A seventh feature, combinable with any of the previous or following features, wherein receiving the representative subsurface model includes generating the representative subsurface model.

An eighth feature, combinable with any of the previous or following features, the method further including receiving the acquisition plan constraints.

In a second implementation, a non-transitory, computer-readable medium storing one or more instructions executable by a computer system to perform operations including: generating a simulated dense wavefield using a representative subsurface model that represents a portion of the earth; generating a set of preliminary acquisition plans according to acquisition plan constraints and the representative subsurface model, each preliminary acquisition plan defining a plurality of surface receivers operable to receive seismic signals; subsampling the target dense wavefield using the set of preliminary acquisition plans to produce a set of subsampled wavefields, each of the subsampled wavefields being associated with a particular preliminary acquisition plan; reconstructing the set of subsampled wavefields according to a reconstruction scheme to produce a set of reconstructed dense wavefields; determining a degree of fidelity for each of the reconstructed dense wavefields; and selecting a preliminary acquisition plan having a degree of fidelity that satisfies a preselected criterion as an optimized acquisition plan.

The foregoing and other described implementations can each, optionally, include one or more of the following features:

A first feature, combinable with any of the following features, wherein selecting an optimized acquisition plan from the set of preliminary acquisition plans that has a degree of fidelity that best satisfies a preselected criterion includes selecting one of the preliminary acquisition plans having a degree of fidelity that meets a user-selected criterion as the optimized acquisition plan.

A second feature, combinable with any of the previous or following features, wherein selecting one of the preliminary acquisition plans having a degree of fidelity that meets a user-selected criterion as the optimized acquisition plan includes selecting a preliminary acquisition plan having a degree of fidelity that is equal to a preselected value, is less than a preselected value, is greater than a preselected value, or is within a range of preselected values.

A third feature, combinable with any of the previous or following features, the computer-readable medium including one or more instructions executable by a computer system to perform operations further including performing an iterative step that includes applying a global optimization scheme to the set of preliminary acquisition plans to generate a new set of preliminary acquisition plans when none of the preliminary acquisition plans has a degree of fidelity that satisfies the preselected criterion; subsampling the target dense wavefield using the new set of preliminary acquisition plans to produce a new set of subsampled wavefields, each of the subsampled wavefields being associated with a particular new preliminary acquisition plan; reconstructing the set of new subsampled wavefields according to a reconstruction scheme to produce a set of reconstructed dense wavefields; determining a degree of fidelity for each of the newly reconstructed dense wavefields; and selecting a new preliminary acquisition plan having a degree of fidelity that satisfies the preselected criterion as the optimized acquisition plan.

A fourth feature, combinable with any of the previous or following features, the computer-readable medium including one or more instructions executable by a computer system to perform operations further including repeating the iterative step for a selected number of cycles when none of the new preliminary acquisition plans of a particular iterative step has a degree of fidelity that satisfies the preselected criterion.

A fifth feature, combinable with any of the previous or following features, the computer-readable medium including one or more instructions executable by a computer system to perform operations further including selecting a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

A sixth feature, combinable with any of the previous or following features, the computer-readable medium including one or more instructions executable by a computer system to perform operations further including receiving the representative subsurface model.

A seventh feature, combinable with any of the previous or following features, wherein receiving the representative subsurface model includes generating the representative subsurface model.

An eighth feature, combinable with any of the previous or following features, the computer-readable medium including one or more instructions executable by a computer system to perform operations further including receiving the acquisition plan constraints.

In a third implementation, a computer-implemented system, including one or more processors and a non-transitory computer-readable storage medium coupled to the one or more processors and storing programming instructions for execution by the one or more processors, the programming instructions instructing the one or more processors to: generate a simulated dense wavefield using a representative subsurface model that represents a portion of the earth; generate a set of preliminary acquisition plans according to acquisition plan constraints and the representative subsurface model, each preliminary acquisition plan defining a plurality of surface receivers operable to receive seismic signals; subsample the target dense wavefield using the set of preliminary acquisition plans to produce a set of subsampled wavefields, each of the subsampled wavefields being associated with a particular preliminary acquisition plan; reconstruct the set of subsampled wavefields according to a reconstruction scheme to produce a set of reconstructed dense wavefields; determine a degree of fidelity for each of the reconstructed dense wavefields; and select a preliminary acquisition plan having a degree of fidelity that satisfies a preselected criterion as an optimized acquisition plan.

The foregoing and other described implementations can each, optionally, include one or more of the following features:

A first feature, combinable with any of the following features, wherein the programming instructions are operable to instruct the one or more processors to perform an iterative step including: applying a global optimization scheme to the set of preliminary acquisition plans to generate a new set of preliminary acquisition plans when none of the preliminary acquisition plans has a degree of fidelity that satisfies the preselected criterion; subsampling the target dense wavefield using the new set of preliminary acquisition plans to produce a new set of subsampled wavefields, each of the subsampled wavefields being associated with a particular new preliminary acquisition plan; reconstructing the set of new subsampled wavefields according to a reconstruction scheme to produce a set of reconstructed dense wavefields; determining a degree of fidelity for each of the new reconstructed dense wavefields; and selecting a new preliminary acquisition plan having a degree of fidelity that satisfies the preselected criterion as the optimized acquisition plan.

A second feature, combinable with any of the previous or following features, wherein the programming instructions are operable to instruct the one or more processors to repeat the iterative step for a selected number of cycles when none of the new preliminary acquisition plans of a particular iterative step has a degree of fidelity that satisfies the preselected criterion.

A third feature, combinable with any of the previous or following features, wherein the programming instructions are operable to instruct the one or more processors to select a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

A fourth feature, combinable with any of the previous or following features, wherein the programming instructions are operable to instruct the one or more processors to select one of the preliminary acquisition plans having a degree of fidelity that meets a user-selected criterion as the optimized acquisition plan includes programming instructions operable to instruct the one or more processors to select a preliminary acquisition plan having a degree of fidelity that is equal to a preselected value, is less than a preselected value, is greater than a preselected value, or is within a range of preselected values.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/nonvolatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer program product encoded on a non-transitory medium, the product comprising computer readable instructions for causing one or more processors to perform operations comprising:
   obtaining a subsurface model that represents a portion of a subsurface;
   generating a simulated dense wavefield by performing a forward modeling on the subsurface model, the simulated dense wavefield representing a target wavefield;
   generating a set of preliminary acquisition plans according to acquisition plan constraints and the representative subsurface model, each preliminary acquisition plan defining a plurality of surface receivers operable to receive seismic signals;
   subsampling the target dense wavefield using the set of preliminary acquisition plans to produce a set of subsampled wavefields, each of the subsampled wavefields being associated with a particular preliminary acquisition plan;
   reconstructing the set of subsampled wavefields according to a reconstruction scheme to produce a set of reconstructed dense wavefields;
   determining a degree of fidelity for each of the reconstructed dense wavefields by, for each reconstructed wavefield:
      comparing the reconstructed dense wavefield to the target wavefield;
      determining, based on comparing, an energy of a mismatch dataset representing a different between the reconstructed dense wavefield and the target wavefield;
      comparing the energy of the mismatch dataset to a particular percentage of an energy of the target wavefield; and
      determining, based on comparing the energy of the mismatch dataset to the particular percentage, whether the reconstructed wavefield satisfies a preselected criterion specifying an optimized acquisition plan; and
   selecting a preliminary acquisition plan having a degree of fidelity that satisfies the preselected criterion as the optimized acquisition plan.

2. The computer program product of claim 1, wherein selecting an optimized acquisition plan from the set of preliminary acquisition plans that has a degree of fidelity that best satisfies a preselected criterion comprises selecting one of the preliminary acquisition plans having a degree of fidelity that meets a user-selected criterion as the optimized acquisition plan.

3. The computer program product of claim 2, wherein selecting one of the preliminary acquisition plans having a degree of fidelity that meets a user-selected criterion as the optimized acquisition plan comprises selecting a preliminary acquisition plan having a degree of fidelity that is equal to a preselected value, is less than a preselected value, is greater than a preselected value, or is within a range of preselected values.

4. The computer program product of claim 1, further comprising:
   performing an iterative step comprising:
      applying a global optimization scheme to the set of preliminary acquisition plans to generate a new set of preliminary acquisition plans when none of the preliminary acquisition plans has a degree of fidelity that satisfies the preselected criterion;
      subsampling the target dense wavefield using the new set of preliminary acquisition plans to produce a new set of subsampled wavefields, each of the subsampled wavefields being associated with a particular new preliminary acquisition plan;
      reconstructing the set of new subsampled wavefields according to a reconstruction scheme to produce a set of reconstructed dense wavefields;
      determining a degree of fidelity for each of the newly reconstructed dense wavefields; and
      selecting a new preliminary acquisition plan having a degree of fidelity that satisfies the preselected criterion as the optimized acquisition plan.

5. The computer program product of claim 4, further comprising repeating the iterative step for a selected number of cycles when none of the new preliminary acquisition plans of a particular iterative step has a degree of fidelity that satisfies the preselected criterion.

6. The computer program product of claim 5, further comprising selecting a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

7. The computer program product of claim 1, further comprising receiving the representative subsurface model.

8. The computer program product of claim 7, wherein receiving the representative subsurface model comprises generating the representative subsurface model.

9. The computer program product of claim 1, further comprising receiving the acquisition plan constraints.

10. A computer-implemented method performed by one or more processors for automatically selecting an optimized acquisition plan, the method comprising the following operations:
   obtaining a subsurface model that represents a portion of a subsurface;
   generating a simulated dense wavefield by performing a forward modeling on the subsurface model, the simulated dense wavefield representing a target wavefield;
   generating a set of preliminary acquisition plans according to acquisition plan constraints and the representative subsurface model, each preliminary acquisition plan defining a plurality of surface receivers operable to receive seismic signals;
   subsampling the target dense wavefield using the set of preliminary acquisition plans to produce a set of subsampled wavefields, each of the subsampled wavefields being associated with a particular preliminary acquisition plan;
   reconstructing the set of subsampled wavefields according to a reconstruction scheme to produce a set of reconstructed dense wavefields;
   determining a degree of fidelity for each of the reconstructed dense wavefields by, for each reconstructed wavefield:
      comparing the reconstructed dense wavefield to the target wavefield;

determining, based on comparing, an energy of a mismatch dataset representing a different between the reconstructed dense wavefield and the target wavefield;

comparing the energy of the mismatch dataset to a particular percentage of an energy of the target wavefield; and determining, based on comparing the energy of the mismatch dataset to the particular percentage, whether the reconstructed wavefield satisfies a preselected criterion specifying an optimized acquisition plan; and selecting a preliminary acquisition plan having a degree of fidelity that satisfies the preselected criterion as the optimized acquisition plan.

11. The computer-implemented method of claim 10, wherein selecting an optimized acquisition plan from the set of preliminary acquisition plans that has a degree of fidelity that best satisfies a preselected criterion comprises selecting one of the preliminary acquisition plans having a degree of fidelity that meets a user-selected criterion as the optimized acquisition plan.

12. The computer-implemented method of claim 11, wherein selecting one of the preliminary acquisition plans having a degree of fidelity that meets a user-selected criterion as the optimized acquisition plan comprises selecting a preliminary acquisition plan having a degree of fidelity that is equal to a preselected value, is less than a preselected value, is greater than a preselected value, or is within a range of preselected values.

13. The computer-implemented method of claim 10, further comprising:

performing an iterative step comprising:

applying a global optimization scheme to the set of preliminary acquisition plans to generate a new set of preliminary acquisition plans when none of the preliminary acquisition plans has a degree of fidelity that satisfies the preselected criterion;

subsampling the target dense wavefield using the new set of preliminary acquisition plans to produce a new set of subsampled wavefields, each of the subsampled wavefields being associated with a particular new preliminary acquisition plan;

reconstructing the set of new subsampled wavefields according to a reconstruction scheme to produce a set of reconstructed dense wavefields;

determining a degree of fidelity for each of the newly reconstructed dense wavefields; and selecting a new preliminary acquisition plan having a degree of fidelity that satisfies the preselected criterion as the optimized acquisition plan.

14. The computer-implemented method of claim 13, further comprising repeating the iterative step for a selected number of cycles when none of the new preliminary acquisition plans of a particular iterative step has a degree of fidelity that satisfies the preselected criterion.

15. The computer-implemented method of claim 14, further comprising selecting a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

16. The computer-implemented method of claim 10, further comprising receiving the representative subsurface model.

17. The computer-implemented method of claim 16, wherein receiving the representative subsurface model comprises generating the representative subsurface model.

18. The computer-implemented method of claim 10, further comprising receiving the acquisition plan constraints.

19. An apparatus for selecting an optimized distribution of seismic sources, seismic receivers, or both based on an optimized acquisition plan, the apparatus comprising:

one or more processors; and a non-transitory computer-readable storage medium coupled to the one or more processors and storing programming instructions for execution by the one or more processors, the programming instructions instructing the one or more processors to:

obtain a subsurface model that represents a portion of a subsurface;

generate a simulated dense wavefield by performing a forward modeling on the subsurface model, the simulated dense wavefield representing a target wavefield;

generate a set of preliminary acquisition plans according to acquisition plan constraints and the representative subsurface model, each preliminary acquisition plan defining a plurality of surface receivers operable to receive seismic signals;

subsample the target dense wavefield using the set of preliminary acquisition plans to produce a set of subsampled wavefields, each of the subsampled wavefields being associated with a particular preliminary acquisition plan;

reconstruct the set of subsampled wavefields according to a reconstruction scheme to produce a set of reconstructed dense wavefields;

determine a degree of fidelity for each of the reconstructed dense wavefields by, for each reconstructed wavefield:

comparing the reconstructed dense wavefield to the target wavefield;

determining, based on comparing, an energy of a mismatch dataset representing a different between the reconstructed dense wavefield and the target wavefield;

comparing the energy of the mismatch dataset to a particular percentage of an energy of the target wavefield; and determining, based on comparing the energy of the mismatch dataset to the particular percentage, whether the reconstructed wavefield satisfies a preselected criterion specifying an optimized acquisition plan; and select a preliminary acquisition plan having a degree of fidelity that satisfies the preselected criterion as the optimized acquisition plan.

20. The apparatus of claim 19, wherein the programming instructions are operable to instruct the one or more processors to:

perform an iterative step comprising:

applying a global optimization scheme to the set of preliminary acquisition plans to generate a new set of preliminary acquisition plans when none of the preliminary acquisition plans has a degree of fidelity that satisfies the preselected criterion;

subsampling the target dense wavefield using the new set of preliminary acquisition plans to produce a new set of subsampled wavefields, each of the subsampled wavefields being associated with a particular new preliminary acquisition plan;

reconstructing the set of new subsampled wavefields according to a reconstruction scheme to produce a set of reconstructed dense wavefields;

determining a degree of fidelity for each of the new reconstructed dense wavefields; and selecting a new preliminary acquisition plan having a degree of fidelity that satisfies the preselected criterion as the optimized acquisition plan.

21. The apparatus of claim 19, wherein the programming instructions are operable to instruct the one or more processors to repeat the iterative step for a selected number of cycles when none of the new preliminary acquisition plans of a particular iterative step has a degree of fidelity that satisfies the preselected criterion.

22. The apparatus of claim 19, wherein the programming instructions are operable to instruct the one or more processors to select a preliminary acquisition plan from a combination of all of the preliminary acquisition plans and new preliminary acquisition plans that has a degree of fidelity that most closely matches the preselected criterion to be the optimized acquisition plan when none of the combination of all of the preliminary acquisition plans and new preliminary acquisition plans has a degree of fidelity that satisfies the preselected criterion.

23. The apparatus of claim 22, wherein the programming instructions are operable to instruct the one or more processors to select one of the preliminary acquisition plans having a degree of fidelity that meets a user-selected criterion as the optimized acquisition plan comprises programming instructions operable to instruct the one or more processors to select a preliminary acquisition plan having a degree of fidelity that is equal to a preselected value, is less than a preselected value, is greater than a preselected value, or is within a range of preselected values.

* * * * *